United States Patent [19]
Chung et al.

[11] Patent Number: 5,422,642
[45] Date of Patent: Jun. 6, 1995

[54] DC CENTERING ANALOG RECEIVER FOR FLASH A/D CONVERTER

[75] Inventors: Paul W. Chung, San Jose, Calif.; John E. Gersbach, Burlington, Vt.; Bac Pham, San Jose, Calif.; Karl Hense, Goldendale, Wash.; Pete Granata, San Martin, Calif.

[73] Assignee: International Business Machines Corporation, Armonk, N.Y.

[21] Appl. No.: 81,760

[22] Filed: Jun. 22, 1993

[51] Int. Cl.⁶ .......................................... H03M 1/06
[52] U.S. Cl. ............................... 341/118; 341/155
[58] Field of Search ............... 307/264, 359, 491; 341/118, 133, 134, 135, 136, 139, 155, 156, 158, 159

[56] References Cited

U.S. PATENT DOCUMENTS

| | | | |
|---|---|---|---|
| 4,274,050 | 6/1981 | Martin | 307/264 X |
| 4,608,555 | 8/1986 | Hoeft | 340/347 |
| 4,639,715 | 1/1987 | Doluca | 340/347 |
| 4,894,657 | 1/1990 | Hwang et al. | 341/158 |
| 4,918,450 | 4/1990 | Sugiyama et al. | 341/159 |
| 5,194,865 | 3/1993 | Mason et al. | 341/139 X |

Primary Examiner—Howard L. Williams
Attorney, Agent, or Firm—Ingrid M. Foerster

[57] ABSTRACT

An analog receiver circuit suitable for use with a flash analog-to-digital converter is described. A first stage of the receiver acts essentially as a voltage follower, receiving the centertap voltage of a flash A/D converter resistor ladder, and maintaining an internal reference voltage substantially equal to the centertap voltage over time. A second stage of the analog receiver acts as centering means, receiving an analog signal and centering it with respect to the internal reference voltage provided by the first stage. The receiver is thus able to provide an analog signal to the flash A/D converter which is dynamically centered with respect to the converter's operating voltage, thereby reducing DC offset. Moreover, introducing the analog signal at the second stage minimizes the bandwidth-limiting elements between this input signal and the DC-centered output signal. Thus DC offset is further reduced and operating frequencies of 500 MTz or greater are possible.

18 Claims, 3 Drawing Sheets

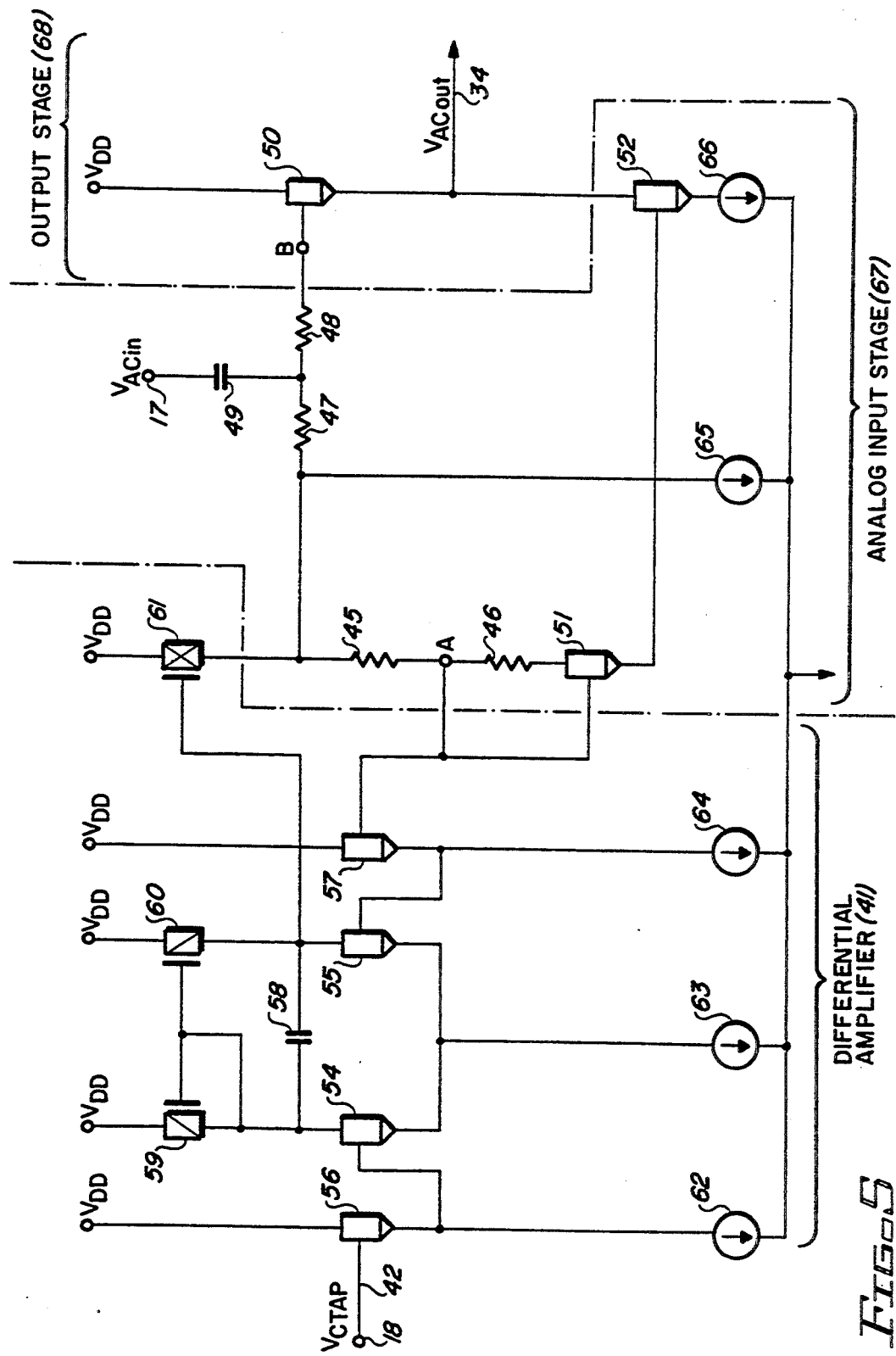

DC CENTERING ANALOG RECEIVER FOR FLASH A/D CONVERTER

BACKGROUND OF THE INVENTION

The present invention relates generally to an analog receiver circuit for providing a DC-centered analog signal to a flash A/D converter. More particularly, the invention relates to an analog receiver circuit for receiving a time-varying read signal from a disk drive, and for dynamically centering the read signal with respect to the DC operating point of a flash A/D converter.

"Flash" A/D converters are well-known in the art and are described in U.S. Pat. No. 4,608,555 issued to Hoeft, which contains additional references on the subject. Flash A/D converters are typically VLSI circuits able to perform rapid, high resolution analog to digital conversions via a simultaneous or "parallel" processing architecture.

A flash A/D converter usually includes an array of comparators and their associated drivers, a resistor ladder with a current source, and an encoder. The comparators simultaneously receive an analog signal input to the converter. Additionally, each comparator is provided with a unique reference voltage from the resistor ladder corresponding to one of N possible converter output states. The outputs of the comparators are coupled to the encoder inputs, and the encoder outputs in turn provide the flash A/D converter output.

The converter design just described is sometimes called a "full flash" A/D converter because all bits are processed simultaneously for one analog input sample. Consequently, this design requires a large number of comparators on a single chip. Alternate designs have been developed to reduce the circuit size by breaking down the processing into cycles. A half-flash A/D converter is described in U.S. Pat. No. 4,639,715 to Chin which performs two processing cycles for every analog input sample, using a lower resolution flash A/D converter. In a first cycle the converter processes the higher-order bits, and in the second cycle it processes the lower-order bits. A pipelined A/D converter such as that described in U.S. Pat. No. 4,894,657 to Hwang et al. uses several processing stages to perform one conversion, each stage comprising a low-resolution flash A/D converter. The disadvantage of these alternate designs is their reduced operating speed.

An n-bit resolution full-flash A/D converter generally includes $(2^n-1)$ comparators corresponding to each possible state of an n-bit output (except zero). The resistor ladder has $(2^n-1)$ taps for providing $(2^n-1)$ unique reference voltages. The encoder has $(2^n-1)$ inputs, coupled respectively to the comparator outputs. Each encoder input corresponds to a unique state of the n-bit output (except zero). Thus the output of the converter will be determined by a high state on one of the comparator outputs (or zero if no input is turned "on").

During operation, an input analog signal is provided to each comparator and is simultaneously compared to each of the $(2^n-1)$ reference voltages, and will cause all the comparators having a reference voltage below or equal to the analog voltage to turn "on". The active comparators are detected by the encoder, which selects an appropriate corresponding output state.

The DC reference voltages of the resistor ladder become smaller as the resolution of the converter increases. This constraint is imposed by the voltage swing of an analog signal, which is generally 2 V or less. The higher the resolution, the smaller the increments into which this voltage range must be divided to represent the number of possible output states.

To perform accurate conversions it is therefore necessary to assure that the flash A/D converter receives an analog signal which is centered with respect to the converter's operating point voltage, which is available at the centertap of the resistor ladder.

In previous designs, the analog signal has been provided to the flash A/D converter by an amplifying receiver. The analog signal is provided to an amplifying circuit such as an operational amplifier. The op amp, in turn, produces an amplified analog signal which is centered with respect to the operating point voltage of the flash A/D converter. DC-centering is achieved by using a current mirroring configuration within the op amp. The converter's operating point voltage is provided via the centertap to the current mirroring circuit. The current mirroring circuit then "mirrors" the centertap voltage internally, thereby establishing the amplifier's own operating point.

A disadvantage of the previous designs is the substantial bandwidth limiting introduced by the amplifying circuit. Since the analog signal is both amplified and DC-centered in one stage, the signal passes through a number of bandwidth-limiting circuit elements before it reaches the converter. Consequently, the system response time of the receiver is reduced, rendering the design impractical in systems which operate at frequencies of 500 MHz and greater.

Other disadvantages of the previous designs relate to DC offsets. As previously discussed, the amplifying circuit is designed to receive the centertap voltage of the flash A/D converter, and to replicate this voltage internally. In theory, the elements of the current-mirroring circuit are identically matched to provide an amplifier operating point exactly equal to that of the converter. But in practice, precise matching is difficult to achieve because of technology limitations. Thus each element of the receiver may introduce a slight DC offset to the analog signal passing through. By the time the signal reaches the converter, its DC offset may be quite large. Such a design is unsatisfactory for converters having low offset requirements. Furthermore, the operational amplifier used in previous designs must provide high gain to minimize offset. A high gain amplifier design is more complex than low gain designs.

Yet another limitation of past designs arises when the centertap reference voltage drifts over time. The current mirror response to such changes tends to be slow, causing a significant offset in the analog signal provided to the converter input until the receiver stabilizes.

Finally, past designs have the disadvantage of poor noise immunity. Present signal-processing chips often comprise a combination of analog and digital components. The digital elements tend to inject a large amount of noise into the system. The amplifying receiver described further degrades the signal to noise ratio, and adversely affects the system error rate.

An attempt has been made to improve the system response time of previous designs by providing both positive and negative voltage sources to the op amp rather than using a single 5 V supply. This modification, however, leads to other problems of high cost, poor technology reliability and complex implementation.

The rapid conversion rate of flash A/D converters is particularly valuable in a variety of applications, including digital magnetic recording channels, cellular phones and satellite communication systems.

What is needed is an analog receiver with minimal buffering introduced between the input and output analog signals, permitting operation at frequencies of 500 MHz or greater with minimal DC offset. Furthermore, the analog receiver must be able to continually track the centertap voltage of the flash A/D converter in order to maintain an operating point substantially equal to the converter's operating point, thus providing a DC-centered analog signal to the converter having minimal DC offset over time. Ideally, the DC offset should be less than ½ of the converter's least significant bit (LSB) reference voltage, since a greater offset can cause a false bit-reading or failure to detect a bit due to the signal displacement with respect to the converter operating voltage. The analog receiver must not degrade the signal-to-noise ratio of the system to any significant extent.

SUMMARY OF THE INVENTION

Accordingly, it is an object of the present invention to provide a DC-centered analog signal to a flash A/D converter at operating frequencies of 500 MHz and greater.

It is a further object of thus invention to significantly reduce the amount of buffering between the analog input signal and the DC-centered output signal in order to minimize bandwidth limiting and DC offsets introduced by the receiver.

It is still a further object of this invention to continually track the centertap reference voltage of a flash A/D converter in order to provide the converter with an analog signal having DC offsets below ½ LSB voltage with respect to the converter's operating point voltage.

It is yet another object of the present invention to provide a receiver suitable for chips comprising both analog and digital components, by minimizing the degradation of signal to noise ratio across the receiver, as compared with previous receiver designs.

In accordance with these and other objects, the present invention is an analog receiver for providing a DC-centered analog signal to a flash A/D converter (or any system with similar input requirements) having a first stage for setting the operating point of the receiver, and having a second stage for receiving and DC-centering an analog signal.

In a preferred embodiment, the first stage of the receiver comprises a differential amplifier having two inputs, an output, and a feedback circuit. The first input receives a DC reference voltage, such as the centertap voltage of a flash A/D converter. The second input is connected to the output via a resistive feedback configuration. During operation, the voltage differential across the amplifier's first and second inputs is driven to zero, thus providing a gain of one.

The second stage of the preferred embodiment comprises a resistive network having two inputs and an output. The first input is coupled to the output of the differential amplifier, and the second input receives an analog signal V(ac). The output serves as the output of the analog receiver. The resistive network is designed to provide a voltage drop between the amplifier output and the receiver output which matches the voltage drop across the amplifier feedback circuit. During quiescent condition (V(ac), −0), the voltage at the receiver output is equal to the voltage at the second amplifier input, which in turn is equal to the voltage at the first amplifier input. Thus the receiver operating point is set to the DC reference voltage provided to the first stage. During operation, the analog signal is provided to the second stage, and will be centered with respect to the operating voltage maintained at the receiver output.

In an alternative embodiment, the analog receiver comprises the first and second input stages described above, and a driver coupled to the output of the second stage for driving the DC-centered analog signal to the comparators of the flash A/D converter (or to any plurality of circuit elements in a system). For example, the driver may comprise an emitter follower.

DESCRIPTION OF THE PREFERRED EMBODIMENT

Figure 1:
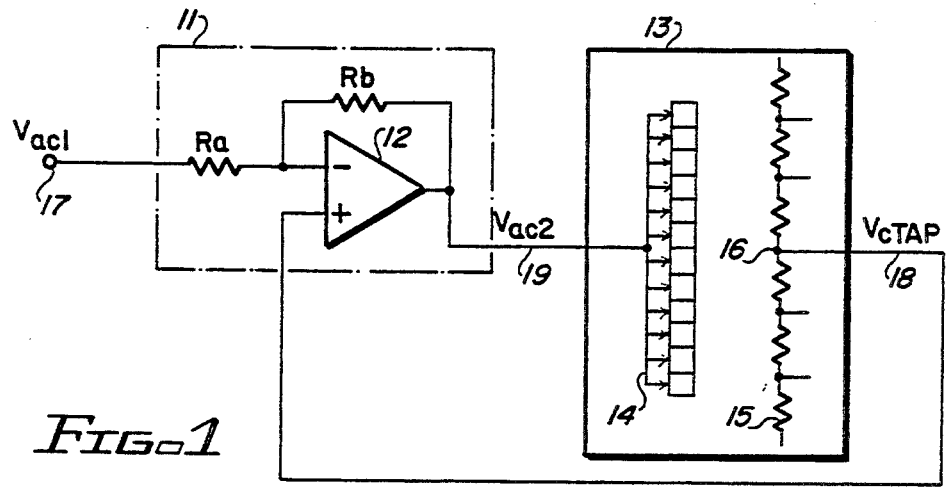
FIG. 1 is a block diagram of a mirror-imaging op-amp receiver previously used in conjunction with a flash A/D converter.

FIG. 1 illustrates a receiver 11 such as those presently used to provide a DC-centered analog signal 19 to a flash A/D converter 13. A flash A/D converter 13 typically includes a resistor ladder 15 and current source (not shown), and an array of comparators 14. The resistor ladder 15 has a plurality of taps for providing a unique reference voltage to each of the comparators 14. A centertap 16 provides centertap voltage 18, the operating point of the converter 13.

The receiver 11 essentially comprises an operational amplifier 12 having a current mirroring circuit (not shown). The op amp 12 receives and amplifies an analog signal 17. The current mirroring circuit sets the operating point of the receiver to a reference voltage substantially equal to the centertap voltage V(ctap) 18 of the converter 13, thereby centering the analog signal 17 with respect to the reference voltage. The resulting amplified, DC-centered analog signal 19 is then provided to the comparators 15.

As discussed previously, the design of FIG. 1 provides insufficient high frequency response. Moreover, it has poor noise immunity in systems having both analog and digital components. In addition, DC offsets introduced across the receiver are too large to meet the stringent requirements for high resolution converters. These problems are resolved in the receiver of FIG. 2 according to the present invention.

Figure 2:
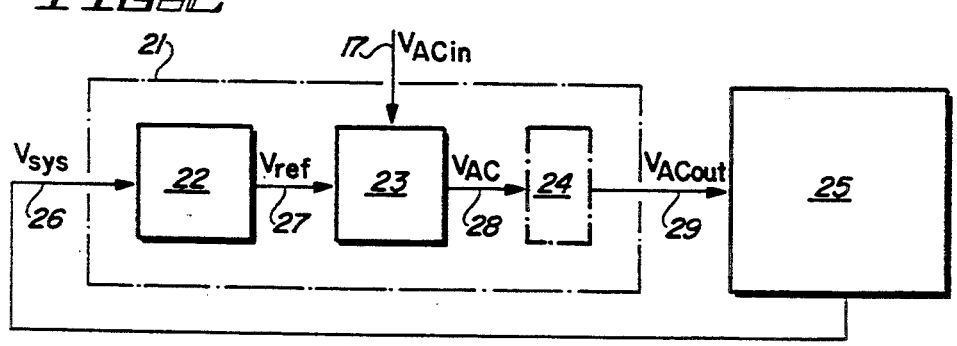
FIG. 2 is a block diagram of the present invention used with a system having low DC offset requirement with respect to an internal reference voltage.

FIG. 2 shows a block diagram of the present invention used in conjunction with a system 25. The system 25 may be a full flash or half-flash A/D converter, the first stage of a pipelined A/D converter, or may be any system requiring an analog signal dynamically centered with respect to the system operating point, V(sys) 26. A DC input stage of the receiver 21 comprises a voltage follower 22, and an analog input stage includes DC centering means 23. In a preferred embodiment, the receiver 21 also includes an output stage comprising a driver 24. The voltage follower 22 receives and dynamically tracks the system reference voltage V(sys) 26, thereby continually maintaining a reference voltage V(ref) 27 equal to V(sys) 26. V(ref) 27 is provided to the DC centering means 23, which receives an analog signal 17. The DC centering means centers analog signal 17 with respect to V(ref) 27, thereby producing a DC-centered analog signal 28 having virtually no DC offset with respect to V(sys) 26.

If the receiver 21 of FIG. 2 is used to provide an analog signal to a large number of circuit elements the comparators of a flash A/D converter), it is preferable to include a driver 24 within the receiver configuration. In previous receiver designs the analog signal was amplified by an op amp. The present design does not amplify the analog signal, as previously discussed, in order to minimize bandwidth-limiting elements between the input analog signal 17 and the DC-centered analog signal 28. Thus, the driver 24 compensates for lack of amplification. The DC-centered analog signal 28 is received by a driver 24, which then provides it to the system 25.

It is important to note that the analog signal 17 is not introduced into the first stage, voltage follower 22, of the receiver 21, but rather is provided to the second stage, DC centering means 23. In contrast, the analog signal 17 of the receiver 11 in FIG. 1 is introduced at the same point as V(ctap) 18. The receiver 21 in FIG. 2 thus reduces the number of elements between the input analog signal 17 and the resulting DC-centered analog signal 29. Consequently, bandwidth limiting and DC offsets introduced by such elements are significantly reduced across the receiver 21.

Figure 3:
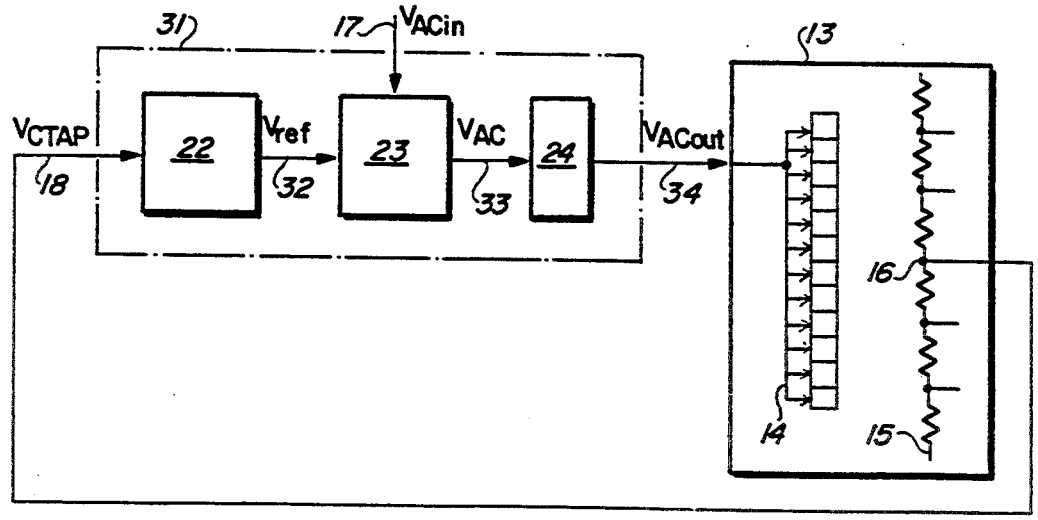
FIG. 3 is a block diagram of the present invention used with a flash A/D converter.
Figure 4:
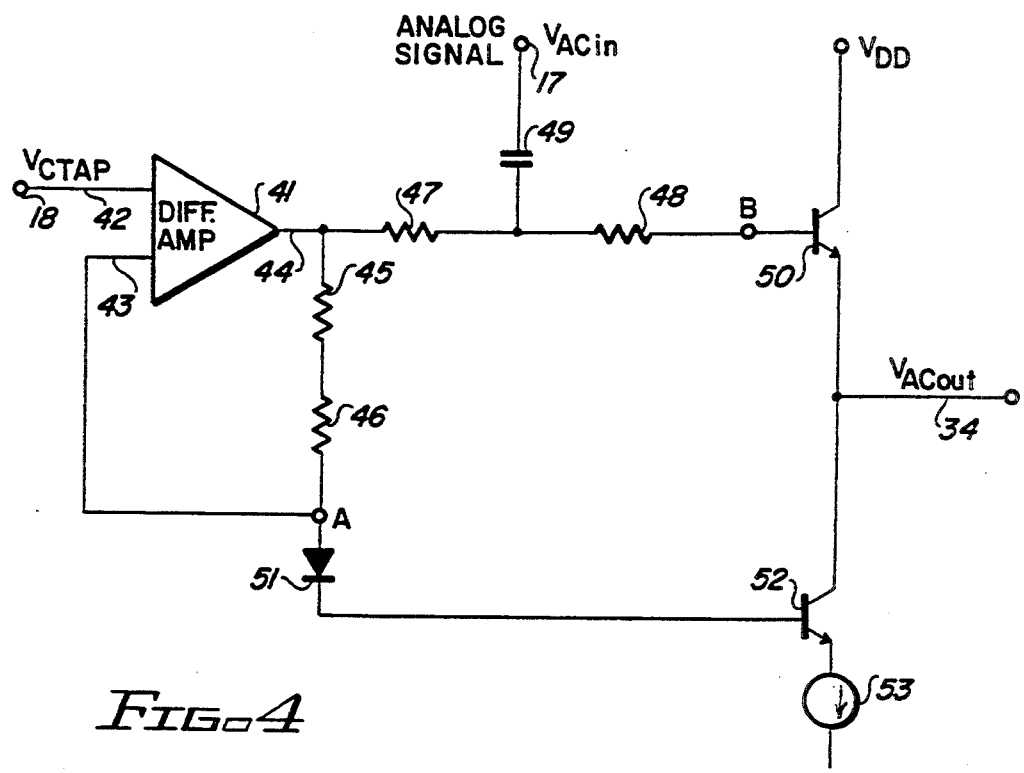
FIG. 4 is circuit diagram of a preferred embodiment of the invention.

FIG. 3 is an illustration of the present invention used in conjunction with a flash A/D converter 13. The operation of the design shown is essentially the same as that of the configuration in FIG. 2. The voltage follower 22 here is coupled to the centertap 16 of the converter's resistor ladder 15, thus receiving centertap reference voltage V(ctap) 18 (the converter's operating point). The voltage follower 22, in turn, provides a reference voltage 32 equal to V(ctap) to the DC centering means 23. The DC centering means 23 receives an analog input signal 17 and centers it with respect to reference voltage 32 to produce DC-centered analog signal 33. Driver 24 then drives the PC-centered signal 33 to the comparator array FIG. 4 shows a circuit diagram of the preferred embodiment of the invention. The input stage comprises a differential amplifier 41 with a feedback circuit. The differential amplifier receives the centertap reference voltage 18 at a first input 42. The voltage generated at the amplifier output 44 is provided to a second amplifier input 43 via a feedback loop including serial resistors 45 and 46. The voltage at output 44 is also provided to the input of an emitter follower 50 through serial resistors 47 and 48.

The resistors 45, 46, 47, and 48, forward-biased diode 51, and a transistor 52 operate together as a voltage divider circuit. The diode 51 is coupled to node A and to the base of the transistor 52. The transistor 52 is connected at its collector to the emitter of emitter follower 50, and at its emitter to current source 53. The diode 51 and transistor 52 cause the voltage drop across resistors 45 and 46 to be equal to the voltage drop across resistors 47 and 48, thereby providing potentials at nodes A and B that are equal to V(ctap) at quiescent condition (V(ACin)=0).

The input analog signal V(ACin) 17 is coupled through a capacitor 49 between the resistor pair 47 and 48, and the resulting DC-centered signal at node B is provided to the emitter follower 50. Termination is provided for the analog signal through resistor 47. The emitter follower 50 drives the signal as V(ACout) 34 to the comparators of a flash A/D converter (not shown). The emitter follower 50 is carefully selected to provide enough drive capabilities for the anticipated load, and to insure that the base-emitter voltage drop matches that of the drivers in the converter driving the reference voltages to the comparators. The independent current source 53 is provided at this stage to bias emitter follower 50 and to isolate the differential amplifier from modulation feedback.

Figure 5:
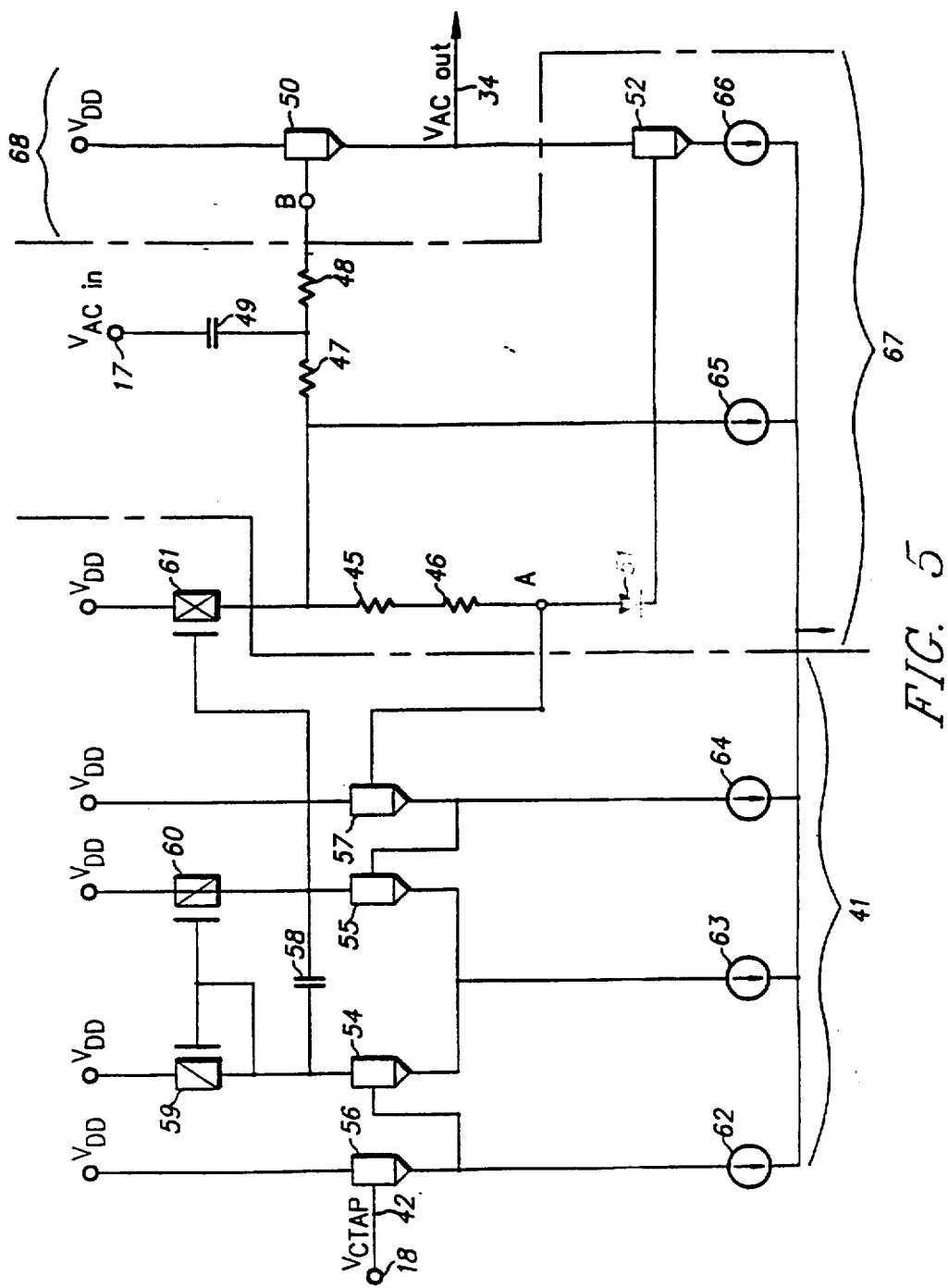
FIG. 5 is a detailed diagram of the preferred embodiment of FIG. 4.

FIG. 5 is a detailed circuit diagram of the preferred embodiment of the present invention. The first stage of the circuit represents the differential amplifier 41 comprising a transistor pair 54, 55 coupled at their emitters to a common current source 63. The transistor collectors have loads 59 and 60. In the preferred embodiment, these are active PFET loads for improved performance and bandwidth. A capacitor 58 disposed between the collectors of the transistor pair 54, 55 is used for high frequency rolloff when the amplifier is not at steady state. Isolation buffers 56 and 57 are coupled to the bases of transistors 54 and 55, respectively. These input buffers provide better isolation from the flash A/D converter resistor ladder (not shown). By way of example, the isolation buffers may be a transistor pair. The centertap reference voltage V(ctap) 18 of the flash A/D converter (not shown) provides the converter's operating point to the differential amplifier 41 at input 42.

The second stage 67 of the circuit represents the analog input stage and comprises the voltage divider circuit previously described. The final stage 68 of the circuit comprises the emitter follower 50 for driving the DC-centered analog signal V(ACout) 34 to the flash A/D converter comparator array (not shown). This stage has been described above with reference to FIG. 4. In the preferred embodiment, the current sources 62, 63, and 64 of the differential amplifier 41 are isolated from the current sources 65 and 66 to eliminate modulation feedback from the analog input stage to the DC input stage.

Figure 6:
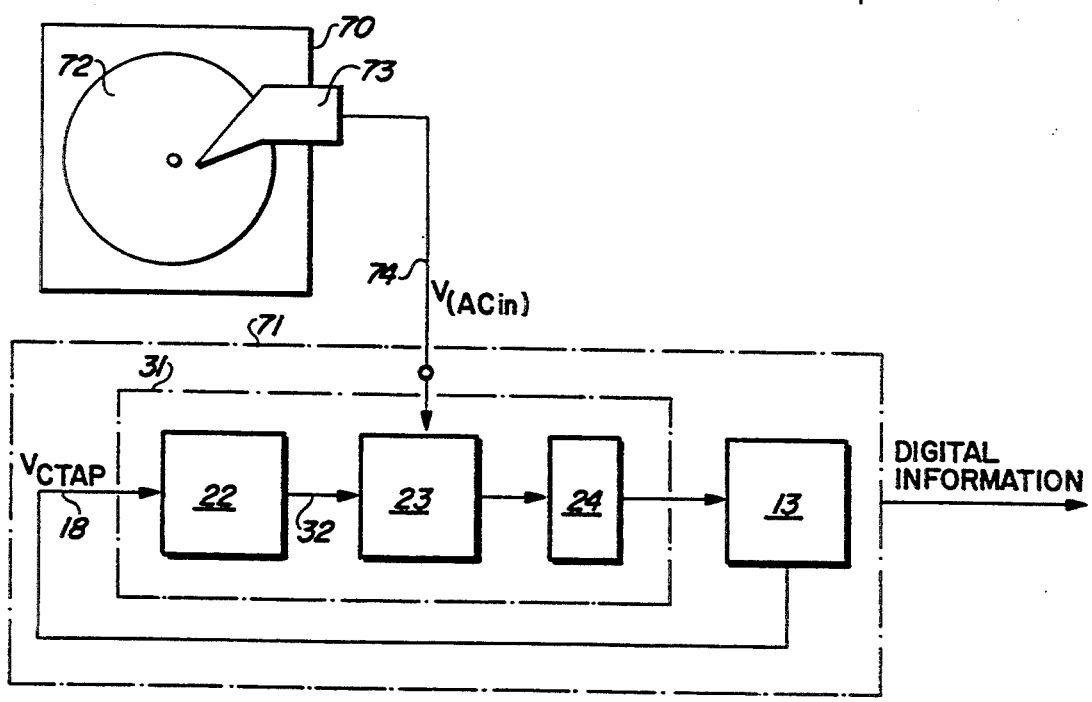
FIG. 6 is a block diagram of a disk drive utilizing the present invention.
Figure 1:
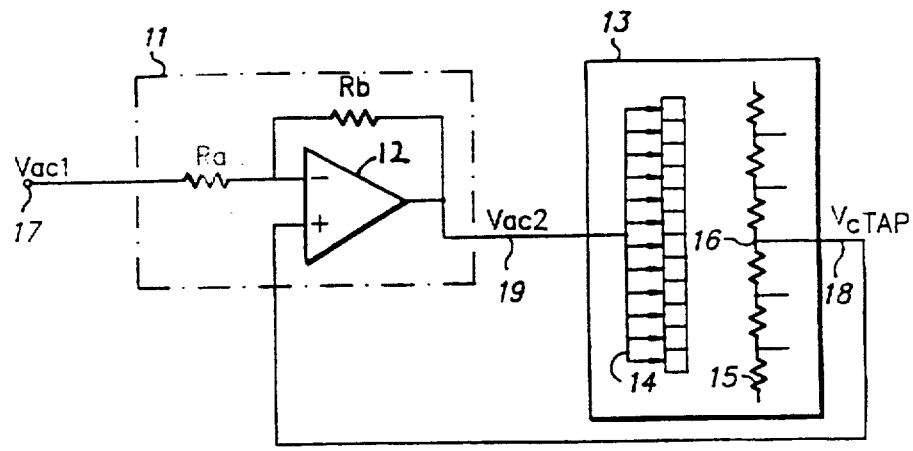
Figure 2:
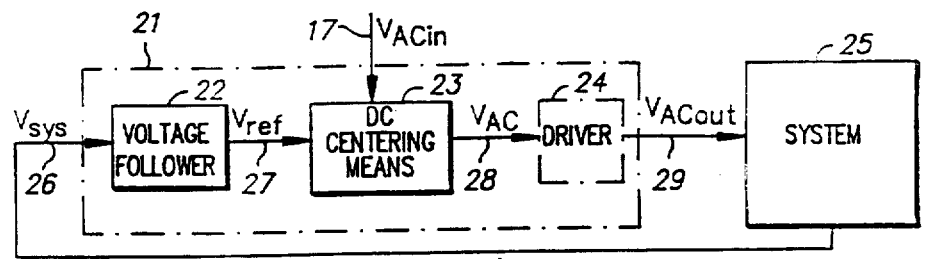
Figure 3:
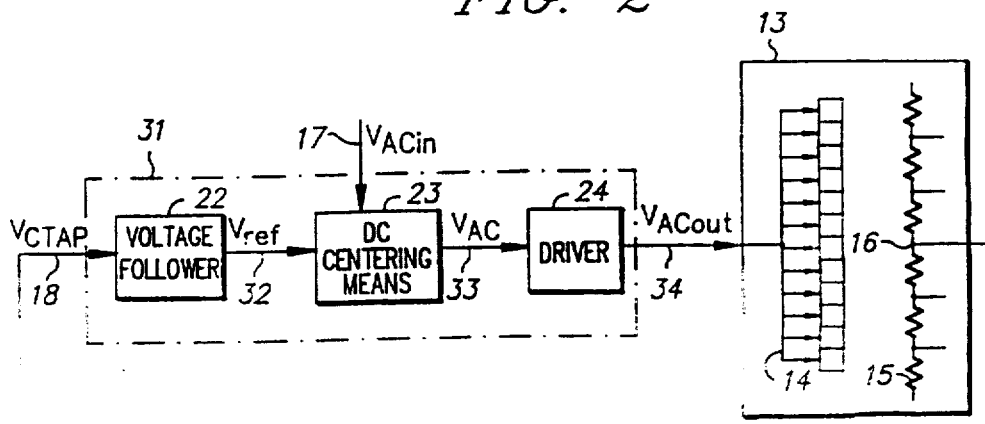
Figure 4:
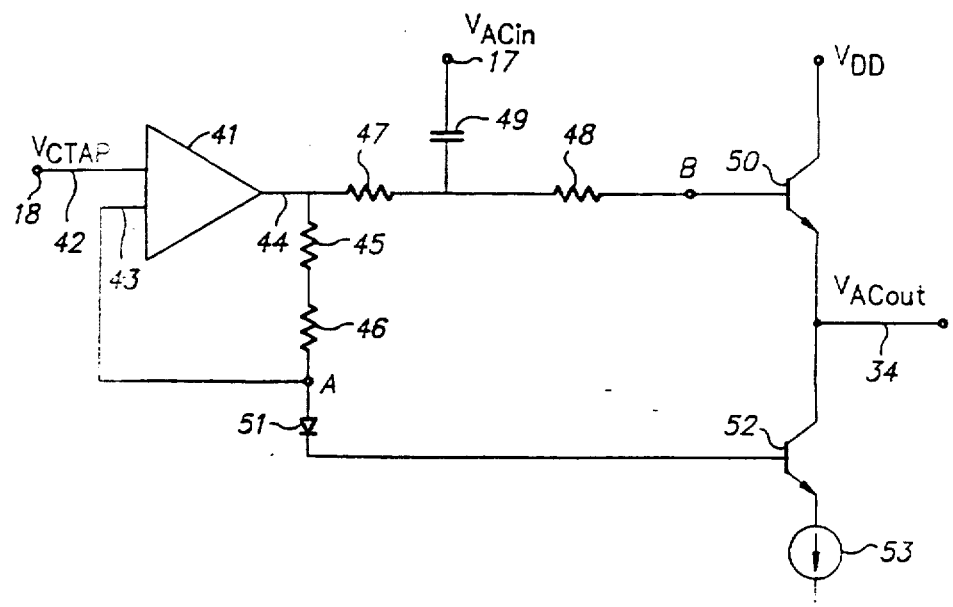
Figure 6:
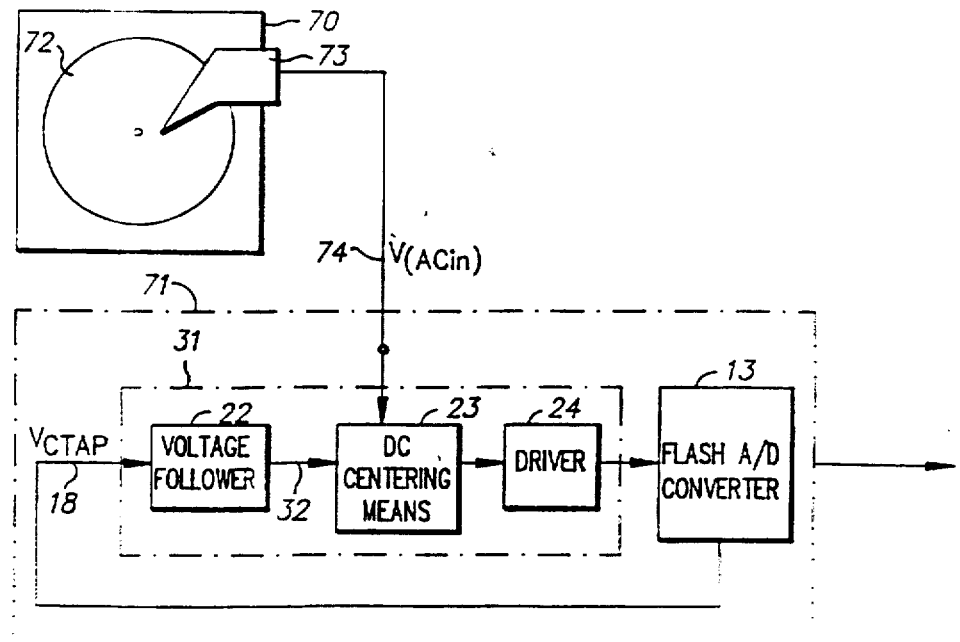

FIG. 6 shows a diagram of a data recording system including a disk drive 70, as is well known in the art, and a channel 71 utilizing the present invention. The system includes at least one rotatable disk 72 capable of storing discrete amounts of information on each of its surfaces. The information is arranged in concentric tracks in the form of magnetic transitions. Reading means 73 detects the stored information and provides it to a channel 71 in the form of an analog signal V(ac) 74. Typically, the reading means 73 comprises a head, actuator arm, and arm electronics. As those skilled in the art will already know, the arm positions the head over a desired track of the rotating disk 72, whereupon the head "reads" a portion of information from the track by detecting the corresponding transitions and producing a representative analog signal, V(ac) 74.

The analog signal 74 from the head must be converted into digital data before it can be used by a central processing unit connected to the channel 71 (not shown). The analog to digital conversion in the system of FIG. 6 is performed by a flash A/D converter 13. The flash A/D converter requires an analog signal which is centered with respect to the converter's operating voltage, V(ctap) 18. A DC-centered analog signal is provided by receiver 31, which was described with reference to FIG. 3 above.

While the invention has been particularly described and illustrated with reference to a preferred embodiment, it will be understood by those skilled in the art that changes in the description or illustrations may be made with respect to form or detail without departing from the spirit and scope of the invention.

We claim:

1. An analog circuit comprising:
   a flash A/D converter operating at a predetermined operating voltage, said flash A/D converter including a plurality of comparators and a resistor ladder having a centertap, wherein said centertap provides said operating voltage of said flash A/D converter; and
   an analog receiver having a system response time of substantially 500 MHz or greater, further comprising:
   a differential amplifier having a first input terminal coupled to said centertap, a second input terminal, and an output terminal;
   feedback means, including a first plurality of resistive elements, for continually providing a voltage at said output terminal to said first plurality of resistive elements, whereby said operating voltage is established at said second input terminal; and
   centering means, further comprising:
     a second plurality of resistive elements coupled to said output terminal of said differential amplifier;
     a current source for providing a voltage drop across said second plurality of resistive elements, whereby a reference voltage substantially equal to said operating voltage is established at a reference node in said centering means;
     means disposed between said second plurality of resistive elements for receiving an analog input signal, wherein an analog signal is produced at said reference node that is centered with respect to said internal reference voltage;
     means for terminating said analog input signal; and
     an emitter follower disposed between said centering means and said flash A/D converter, wherein said emitter follower receives said centered analog signal from said reference node and provides it to said plurality of comparators in said flash A/D converter.

2. An analog receiver circuit, comprising:
   a differential amplifier including a noninverting input for receiving a DC reference voltage, an inverting input, and an output coupled to said inverting input through a resistive circuit, wherein a first voltage is maintained at said second input substantially equal to said DC reference voltage; and
   a DC centering stage coupled to said amplifier, comprising means for receiving an analog signal and means for DC centering said analog signal with respect to said first voltage.

3. The receiver circuit of claim 2, wherein said DC centering stage further comprises,
   a first resistive element including a first terminal coupled to said amplifier output, and a second terminal
   a second resistive element including third terminal coupled to said second terminal, and a fourth terminal,
   a capacitor coupled between said first and second resistive elements for receiving an analog signal, and
   means for maintaining a second voltage at said fourth terminal substantially equal to said DC reference voltage,
   wherein said analog signal is DC centered with respect to said second voltage at said fourth terminal.

4. The analog receiver of claim 3, wherein said means for maintaining said second voltage further comprises,
   a first transistor including a first collector, a first emitter, and a first base coupled to said fourth terminal,
   a second transistor including a second collector coupled to said first emitter, a second emitter, and a second base,
   a current source coupled to said second emitter, and
   a diode including an input coupled to said second input of said amplifier, and an output coupled to said second base.

5. The analog receiver circuit of claim 3, further comprising means for providing said DC-centered analog signal to a plurality of circuit elements.

6. The analog receiver circuit of claim 5, wherein said providing means further comprises an emitter follower coupled to said fourth terminal.

7. The analog receiver circuit of claim 5, wherein said plurality of circuit elements comprises a plurality of comparators in a flash A/D converter.

8. The analog receiver circuit of claim 2, wherein said DC reference voltage slowly varies with respect to a nominal voltage level over time.

9. The analog receiver circuit of claim 2, wherein said DC reference voltage is provided by a flash A/D converter operating at a predetermined operating voltage, and wherein said DC reference voltage is substantially equal to said predetermined operating voltage.

10. An analog circuit comprising:
    an A/D converter operating at a predetermined operating voltage; and
    an analog receiver, comprising:
      a differential amplifier including a noninverting input for receiving a DC reference voltage substantially equal to said operating voltage, an inverting input, and an output coupled to said inverting input through a resistive circuit, wherein a first voltage is maintained at said second input substantially equal to said DC reference voltage, and
      a DC centering stage coupled to said amplifier, comprising means for receiving an analog signal, means for DC centering said analog signal with respect to said first voltage, and means for providing said DC centered analog signal to said A/D converter.

11. The analog circuit of claim 10, wherein said DC centering stage further comprises,
    a first resistive element including a first terminal coupled to said amplifier output, and a second terminal
    a second resistive element including third terminal coupled to said second terminal, and a fourth terminal,
    a capacitor including a first end for receiving an analog signal and a second end coupled between said first and second resistive elements, and
    means for maintaining a second voltage at said fourth terminal substantially equal to said DC reference voltage, wherein said analog signal is DC centered with respect to said second voltage at said fourth terminal.

12. The analog circuit of claim 11, wherein said means for maintaining said second voltage further comprises,
   a first transistor including a first collector, a first emitter, and a first base coupled to said fourth terminal,
   a second transistor including a second collector coupled to said first emitter, a second emitter, and a second base,
   a current source coupled to said second emitter, and
   a diode including an input coupled to said second input of said amplifier, and an output coupled to said second base.

13. The analog circuit of claim 10, wherein said DC reference voltage slowly varies with respect to a nominal voltage level over time.

14. The analog circuit of claim 10, wherein said A/D converter further comprises a plurality of comparators for receiving said DC centered analog signal, and a voltage reference ladder coupled to said comparators, including a centertap for providing a voltage substantially equal to said operating voltage.

15. The analog receiver of claim 14, wherein said DC reference signal is provided to said analog receiver by coupling said centertap to said noninverting input.

16. The analog circuit of claim 10, wherein said A/D converter is a flash A/D converter.

17. The analog circuit of claim 10, wherein said means for providing said DC centered analog signal to said A/D converter further comprises an emitter follower coupled at its base to said fourth terminal, and coupled at its emitter to said A/D converter.

18. An analog receiver, comprising:
   a differential amplifier, including a noninverting input for receiving a DC reference voltage, an inverting input, and an output;
   a resistive network connected between said amplifier output and said inverting input, whereby a first voltage is maintained at said inverting input substantially equal to said DC reference voltage;
   first and second serially connected resistive elements coupled to said amplifier output;
   a capacitor coupled between said first and second resistive elements, for receiving an analog signal;
   a first transistor including a first collector, a first emitter, and a first base coupled to said second serially connected resistive element;
   a second transistor including a second collector coupled to said first emitter, a second emitter, and a second base;
   a first current source coupled to said second emitter;
   a second current source coupled to said amplifier output; and
   a diode including an input coupled to said second input of said amplifier, and an output coupled to said second base.

* * * * *

UNITED STATES PATENT AND TRADEMARK OFFICE
CERTIFICATE OF CORRECTION

PATENT NO. : 5,422,642
DATED : June 6, 1995
INVENTOR(S) : Chung et al.

It is certified that error appears in the above-indentified patent and that said Letters Patent is hereby corrected as shown below:

IN THE DRAWINGS

Delete Figures" 1, 2, 3, 4, 5, and 6", Replace with attached Figures -- 1, 2, 3, 4, 5, and 6--.

Signed and Sealed this

Eighteenth Day of June, 1996

Attest:

BRUCE LEHMAN

*Attesting Officer*      *Commissioner of Patents and Trademarks*